(12) United States Patent
Sudo (10) Patent No.: US 9,996,295 B2
(45) Date of Patent: Jun. 12, 2018

(54) SEMICONDUCTOR MEMORY DEVICE HAVING BUFFER/SENSING CIRCUIT AND SCRAMBLING/DESCRAMBLING METHOD THEREOF

(71) Applicant: Winbond Electronics Corp., Taichung (TW)

(72) Inventor: Naoaki Sudo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 30 days.

(21) Appl. No.: 15/239,758

(22) Filed: Aug. 17, 2016

(65) Prior Publication Data

US 2017/0228189 A1 Aug. 10, 2017

(30) Foreign Application Priority Data

Feb. 9, 2016 (JP) ................................ 2016-022462

(51) Int. Cl.
*G11C 11/34* (2006.01)
*G11C 16/04* (2006.01)
(Continued)

(52) U.S. Cl.
CPC .......... *G06F 3/0638* (2013.01); *G06F 3/0616* (2013.01); *G06F 3/0679* (2013.01);
(Continued)

(58) Field of Classification Search
CPC .... G06F 3/0638; G06F 3/0679; G06F 3/0616; G06F 12/1425; G06F 2212/1052;
(Continued)

(56) References Cited

U.S. PATENT DOCUMENTS 8,127,200 B2 2/2012 Sharon et al.
2003/0217314 A1* 11/2003 Park ...................... G11C 29/36
714/720
(Continued)

FOREIGN PATENT DOCUMENTS

JP 2008198299 8/2008
JP 2013125452 6/2013
(Continued)

OTHER PUBLICATIONS

"Office Action of Korea Counterpart Application," with English translation thereof, dated May 17, 2017, p. 1-p. 8, in which the listed references (Foreign patent No. 1-2) were cited.

*Primary Examiner* — Hong Kim
(74) *Attorney, Agent, or Firm* — JCIPRNET (57) ABSTRACT

A semiconductor memory device and a scrambling method thereof are provided, which are capable of realizing a balance between a data scrambling function and an accessible time. The semiconductor memory device of the invention includes a page buffer/sense circuit with the data scrambling function. During a programming operation, the page buffer/sense circuit holds data to be programmed, performs a scrambling process on the held data and programs the scrambled data to a selected page of a memory array. During a reading operation, the page buffer/sense circuit holds data read from the selected page and performs a descrambling process on the held data.

11 Claims, 6 Drawing Sheets

(51) Int. Cl.
*G06F 3/06* (2006.01)
*G11C 16/10* (2006.01)
*G11C 16/22* (2006.01)
*G11C 16/24* (2006.01)
*G11C 16/26* (2006.01)
*G11C 16/30* (2006.01)
*G11C 16/34* (2006.01)
*G11C 7/10* (2006.01)

(52) U.S. Cl.
CPC ............ *G11C 7/106* (2013.01); *G11C 7/1006* (2013.01); *G11C 16/0483* (2013.01); *G11C 16/10* (2013.01); *G11C 16/22* (2013.01); *G11C 16/24* (2013.01); *G11C 16/26* (2013.01); *G11C 16/30* (2013.01); *G11C 16/3427* (2013.01); *G11C 16/3459* (2013.01); *G06F 3/0619* (2013.01); *G06F 2212/1052* (2013.01); *G06F 2212/7209* (2013.01)

(58) Field of Classification Search
CPC ........... G06F 2212/7209; G06F 3/0619; G11C 16/3427; G11C 7/106; G11C 7/1006; G11C 16/24; G11C 16/26; G11C 16/0483; G11C 16/10; G11C 16/22; G11C 16/3459; G11C 16/30

USPC ............ 365/185.14, 189.05, 185.2; 711/103
See application file for complete search history.

(56) References Cited

U.S. PATENT DOCUMENTS

| | | | |
|---|---|---|---|
| 2010/0182830 A1* | 7/2010 | Ryu | G11C 16/10 365/185.2 |
| 2012/0008425 A1* | 1/2012 | Park | G11C 7/1006 365/189.05 |
| 2012/0297271 A1 | 11/2012 | Sommer et al. | |
| 2013/0163332 A1 | 6/2013 | Cha | |
| 2014/0050005 A1 | 2/2014 | Choi et al. | |
| 2016/0203328 A1* | 7/2016 | Sawada | G06F 21/85 726/26 |
| 2016/0283113 A1* | 9/2016 | Sudo | G06F 3/061 |
| 2016/0284411 A1* | 9/2016 | Sudo | G11C 16/10 |

FOREIGN PATENT DOCUMENTS

| | | |
|---|---|---|
| JP | 2013125570 | 6/2013 |
| KR | 20090118060 | 11/2009 |
| KR | 20130046190 | 5/2013 |

* cited by examiner

FIG.7B

SEMICONDUCTOR MEMORY DEVICE HAVING BUFFER/SENSING CIRCUIT AND SCRAMBLING/DESCRAMBLING METHOD THEREOF

CROSS-REFERENCE TO RELATED APPLICATION

This application claims the priority benefit of Japan application serial no. 2016-022462, filed on Feb. 9, 2016. The entirety of the above-mentioned patent application is hereby incorporated by reference herein and made a part of this specification.

BACKGROUND OF THE INVENTION

1. Field of the Invention

The invention relates to a semiconductor memory device such as a NAND flash memory, and more particularly, relates to a scrambling method for data in the NAND flash memory.

2. Description of Related Art

The NAND flash memory has a memory array including a plurality of blocks. A NAND string is formed by connecting a plurality of memory cells in series in one block. Typically, data is read or programmed in page units, but erased in block units.

Patent Document 1 discloses a data writing method for improving an operating reliability of the NAND flash memory. Said writing method selects a scrambling method based on an address of a word line, scrambles data to be written according to the selected scrambling method, and writes the scrambled data to a corresponding page.

PRIOR ART DOCUMENT

Patent Document

Patent Document 1: Japanese Patent Publication No. 2008-198299

Problems to be Solved by the Invention

A memory cell of the NAND flash memory includes an N-type MOS (Metal Oxide Semiconductor) structure having a floating gate (charge accumulation layer) and a control gate. When the floating gate accumulates electrons, a threshold of the memory cell shifts in a positive direction to show a state of data "0". On the other hand, when the floating gate releases electrons, said threshold shifts in a negative direction to show a state of data "1". When one specific block is completely erased, all the memory cells in the specific block are data "1".

When this type of flash memory is repeatedly programmed (written) or erased, deteriorations may occur on reliability depending on the data. For example, in a programming operation, a ratio of data "0" to data "1" may be overwhelmingly greater; or, conversely, a ratio of data "1" to data "0" may be overwhelmingly greater. As results from miniaturization and high integration of the memory cells, distances between the memory cells are shorten so a mutual interference may occur on adjacent memory cells due to capacitive coupling. If peripheral memory cells surrounding one specific memory cell are all data "0", charges in the peripheral memory cells can influence the specific memory cell so the threshold thereof becomes higher, as compared to when all of the peripheral memory cells are data "1". Accordingly, because of a floating voltage difference on source line voltages used when data is read, non-uniformity of data "0" or data "1" may also result in adverse effects on a property of a sense amplifier.

Therefore, from the perspective of the reliability, the ideal ratio of data "0" to data "1" is approximately 0.5. A data scrambling scheme is introduced as a method for realizing such ratio. The data scrambling scheme uses a random number to perform a scrambling process on data to be programmed, and programs the scrambled data to the memory array. The scrambling process can, for example, use the address to be programmed as seeds and change the random number for each address. By doing so, data "0" and data "1" may be randomly disposed in row and column directions of the memory array. Further, during a reading operation, a descrambling process may be performed by using the random number used when the scrambling process is performed on data read from the memory array, so as to convert the scrambled data into original data.

Figure 1:
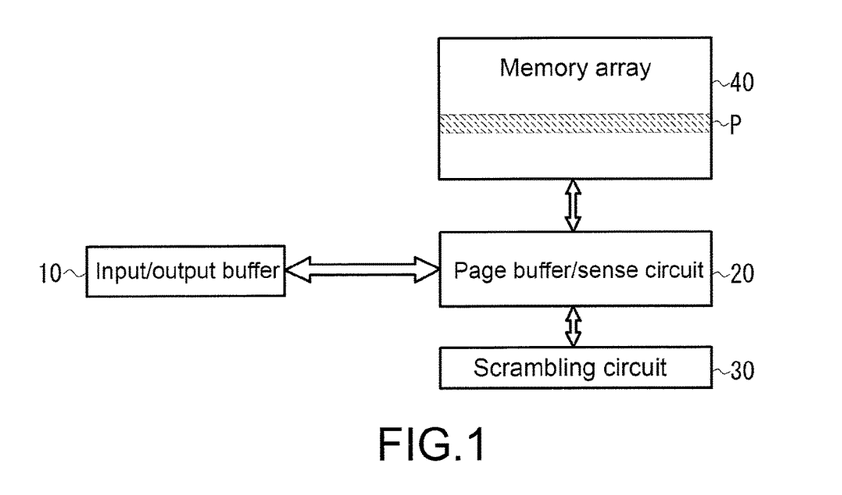
FIG. 1 is a diagram illustrating a scrambling process for a conventional NAND flash memory.

In the NAND flash memory with a data scrambling function, as shown in FIG. 1, a page buffer/sense circuit 20 can receive data to be programmed via an input/output buffer 10 during the programming operation. Then, the data to be programmed is transmitted to a scrambling circuit 30 and scrambled therein. The scrambled data is again transmitted to the page buffer/sense circuit 20 and programmed in a selected page P of a memory array 40. During the reading operation, the data is read from the selected page P of the memory array 40 to the page buffer/sense circuit 20. Then, the data held in the page buffer/sense circuit 20 is transmitted to the scrambling circuit 30, descrambled therein and converted into the original data. The converted data is again transmitted to the page buffer/sense circuit 20 and outputted from the input-output buffer 10.

In the scrambling process for programming data or the descrambling process for reading data, the NAND flash memory will output a busy signal for denying external access. However, duration of the busy signal will correspondingly extend if a process time of the scrambling circuit takes too long, such that an accessible time for external access will be restricted significantly.

SUMMARY OF THE INVENTION

The invention aims to solve the conventional problem as mentioned above by providing a semiconductor memory device capable of realizing a balance between the data scrambling function and the accessible time of external access.

Technical Means for Solving the Problem

A scrambling method for a semiconductor memory device of the invention includes: holding data to be programmed, performing a scrambling process on the held data and programming the scrambled data to a selected page of a memory array by a page buffer/sense circuit during a programming operation, and holding data read from the selected page and performing a descrambling process on the held data by the page buffer/sense circuit during a reading operation.

Preferably, the scrambling process or the descrambling process inverts or non-inverts the held data. Preferably, the scrambling process or the descrambling process inverts or non-inverts the held data according to a random number based on address information of the selected page. Preferably, the scrambling process or the descrambling process includes steps of: transmitting data held in a node of a latch circuit to a gate of a first transistor; resetting the node of the latch circuit by a first voltage supplied by a first voltage supplier; supplying a second voltage supplied by a second voltage supplier to the first transistor; and inverting or non-inverting the data of the node of the latch circuit by the second voltage via the first transistor. Preferably, the first voltage is GND and the second voltage is VDD when the data is to be non-inverted, and the first voltage is VDD and the second voltage is GND when the data is to be inverted. Preferably, the first voltage is supplied to the node via a second transistor for pre-charging a bit line and a third transistor for enabling a charge transport between a sense node and the node when the node of the latch circuit is to be reset. Preferably, the first transistor is turned on when a sense node is charged by the second voltage during a programming verification.

A semiconductor memory device of the invention includes: a memory array; and a page buffer/sense circuit, holding data to be programmed to a selected page of the memory array, or holding data read from the selected page of the memory array. The page buffer/sense circuit performs a scrambling process on the data to be programmed during a programming operation, and performs a descrambling process on the read data during a reading operation.

Preferably, the scrambling process or the descrambling process inverts or non-inverts the held data according to a random number based on address information of the selected page. Preferably, the page buffer/sense circuit includes a latch circuit for holding data and a sense circuit connected to the latch circuit. The sense circuit includes: a first transistor, connected to a second voltage supplier, and capable of holding data held in a node of the latch circuit at a gate; a second transistor, connected to a first voltage supplier, and configured to pre-charge a bit line; and a third transistor, for enabling a charge transport between a sense node and the node of the latch circuit. When the scrambling process or the descrambling process is performed, the data held in the node of the latch circuit is held at the gate of the first transistor, a first voltage supplied by the first voltage supplier is supplied to the node of the latch circuit via the second transistor and the third transistor, and then a second voltage supplied by the second voltage supplier is supplied to the node of the latch circuit according to an on state of the first transistor. Preferably, the first voltage is GND and the second voltage is VDD when the data is to be non-inverted, and the first voltage is VDD and the second voltage is GND when the data is to be inverted. Preferably, the first voltage supplier supplies a pre-charge voltage to a selected bit line via the second transistor during the reading operation, and the third transistor transmits a potential read from the sense node to the node of the latch circuit during the reading operation. Preferably, the second voltage supplier supplies the second voltage to the sense node via the first transistor during a programming verification.

Effect of the Invention

According to the invention, the page buffer/sense circuit is capable of performing the scrambling process for the data to be programmed and the descrambling process for the read data. Therefore, it is no longer required to output the busy signal in the scrambling or descrambling processes so the external access may be performed. Furthermore, the invention can realize the scrambling process/descrambling processes by utilizing the conventional page buffer/sense circuit. As a result, it is not required to dispose additional circuits for scrambling such that both space and cost may be saved accordingly.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention are described in detail below by reference with accompanied figures. In addition, it should be noted that parts of the accompanied figures are exaggerated to emphasize on certain features to make it more apparent for understanding, and the scales thereof are different from the actual devices.

Figure 2:
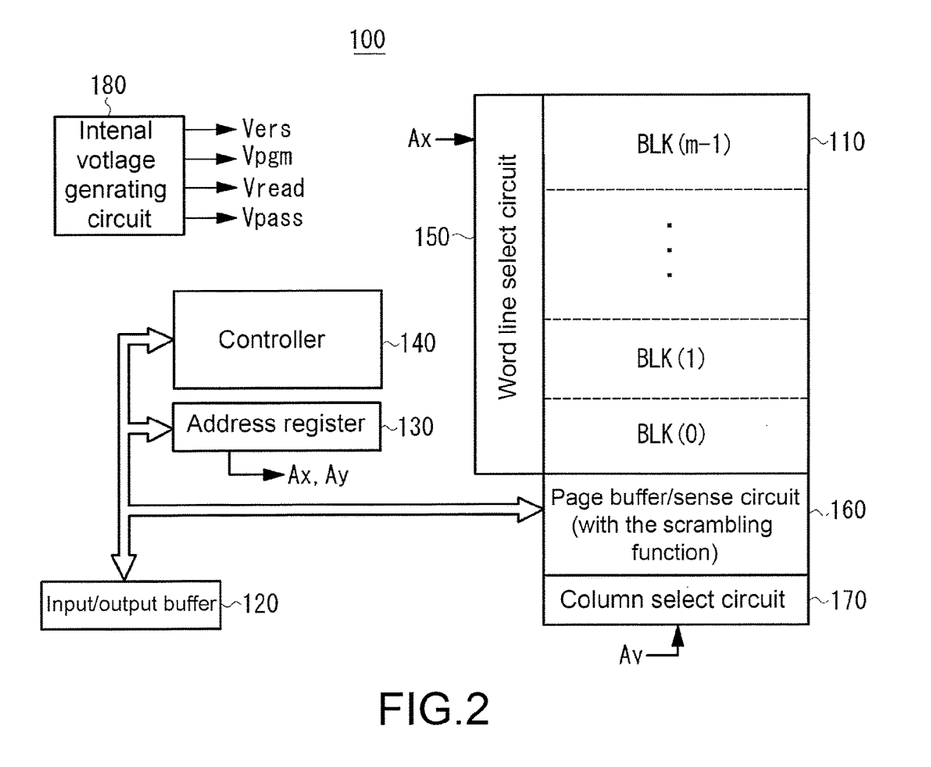
FIG. 2 is a schematic diagram illustrating an overall structure of a NAND flash memory according to an embodiment of the invention.

FIG. 2 is a typical structure of a flash memory according to an embodiment of the invention. A flash memory 100 of the present embodiment includes: a memory array 110, which is formed by a plurality of memory cells arranged in matrix; an input-output buffer 120, which is connected to an external input/output terminal I/O, and holds input/output data; an address register 130, which receives address data from the input-output buffer 120; a controller 140, which receives command data from the input/output buffer 120 or an external control signal to control each part; a word line select circuit 150, which receives row address information Ax from the address register 130, decodes the row address information Ax, and performs a block selection and a word line selection based on a decoding result, etc; a page buffer/sense circuit 160, which holds data read from a page selected by the word line select circuit 150, or holds data to be written to the selected page; a column select circuit 170, which receives column address information Ay from the address register 130, decodes the column address information Ay, and performs a selection of data in the page buffer/sense circuit 160 based on a decoding result, etc; and an internal voltage generating circuit 180, which generates various voltages (a write voltage Vpgm, a pass voltage Vpass, a read pass voltage Vread, an erase voltage Vers, etc.) required for reading, programming and erasing data. The structure of the flash memory shown in FIG. 2 is merely an example, and the invention is not limited only to be this kind of structure.

The memory array 110 has m blocks BLK(0), BLK(1), . . . , and BLK(m−1) disposed along a column direction. The page buffer/sense circuit 160 is disposed adjacent to the block BLK(0). Other than this structure, the page buffer/sense circuit 160 may also be disposed on another end of the blocks or on two ends at both sides of the blocks.

Figure 3:
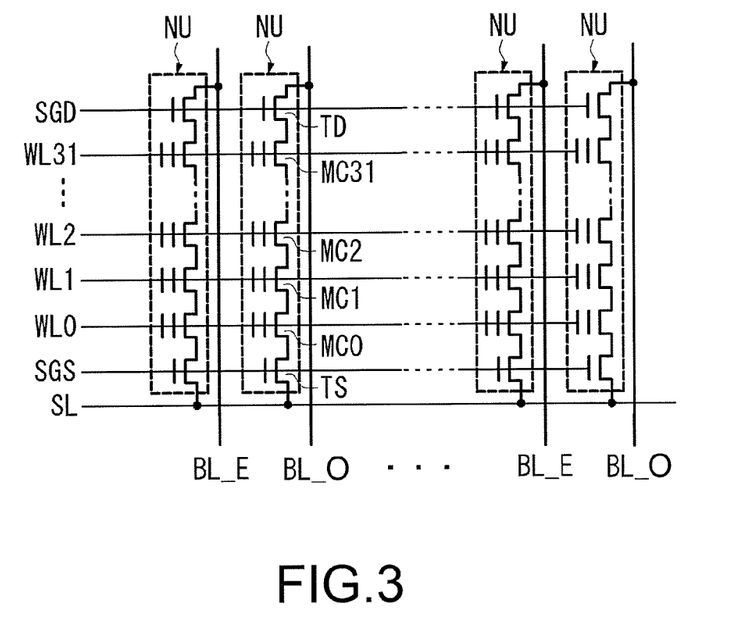
FIG. 3 is a circuit diagram illustrating a structure of a NAND string of a memory cell array according to an embodiment of the invention.

A plurality of NAND string units NU are formed in one memory block, as shown in FIG. 3. Each NAND string unit NU is formed by a plurality of memory cells connected in series. These NAND string units NU are connected to even bit lines BL_E or odd bit lines BL_O, respectively. One NAND string unit NU includes a plurality of memory cells MCi (i=0, 1, . . . , 31) connected in series, a bit line select transistor TD connected to one end (i.e., the memory cell MC31), and a source line select transistor TS connected to another end (i.e., the memory cell MC0). A drain of the bit line select transistor TD is connected to the corresponding even or odd bit line. A source of the source line select transistor TS is connected to a common source line SL.

A control gate of the memory cell MCi is connected to a word line WLi, and gates of the select transistors TD and TS are connected to select gate lines SGD and SGS in parallel with the word lines WL, respectively. When the word line select circuit 150 selects the block based on the row address information Ax or a converted address, the select transistors TD and TS are selectively driven by the select gate lines SGS and SGD of the block. FIG. 3 illustrates a typical NAND string unit, and yet the NAND string unit may further include one or more dummy cells adjacent to the source line select transistor TS or the bit line select transistor TD.

Typically, the memory cell has a MOS structure, and the MOS structure includes: source/drain, serving as a N-type diffusion region and formed inside a P-well; a tunneling oxide film, formed on a channel between the source/drain; a floating gate (a charge accumulation layer), formed on the tunneling oxide film; and a control gate, formed on the floating gate through a dielectric film. When the charges are not accumulated in the floating gate (i.e., in which data "1" is written), a threshold thereof is in a negative state and the memory cell is normally on. When the charges are accumulated in the floating gate (i.e., in which data "0" is written), the threshold shifts to a positive state, and the memory cell is normally off. The memory cell may be a SLC (Single Level Cell) type capable of storing one bit (binary data) and may also be a MLC (Multi Level Cell) type capable of storing multiple bits.

Table 1 is a table illustrating bias voltages applied in each operation of the flash memory. During a reading operation, a specific positive voltage is applied to the bit line; a specific voltage (e.g., 0 V) is applied to a selected word line; the pass voltage Vpass (e.g., 4.5 V) is applied to a non-selected word line; a positive voltage (e.g., 4.5 V) is applied to the select gate lines SGD and SGS, so the bit line select transistor TD and the source line select transistor TS are turned on; and 0 V is applied to the common source line. During a programming (writing) operation, the program voltage Vpgm (15 V to 20 V) of high voltage is applied to the selected word line; an intermediate potential (e.g., 10 V) is applied to the non-selected word line; the bit line select transistor TD is turned on; the source line select transistor TS is turned off; and a potential corresponding to the data "0" or "1" is provided to the bit line. During an erasing operation, 0 V is applied to the selected word line in the block; a high voltage (e.g., 21 V) is applied to the P-well; and electrons of the floating gate are extracted to a substrate. As such, the data is erased in block units.

TABLE 1

|  | Erasing | Writing | Reading |
| --- | --- | --- | --- |
| Selected word line | 0 | 15~20 V | 0 |
| Non-selected word line | F | 10 V | 4.5 |
| SGD | F | Vcc | 4.5 |
| SGS | F | 0 | 4.5 |
| SL | F | Vcc | 0 |
| P-well | 21 | 0 | 0 |

Figure 4:
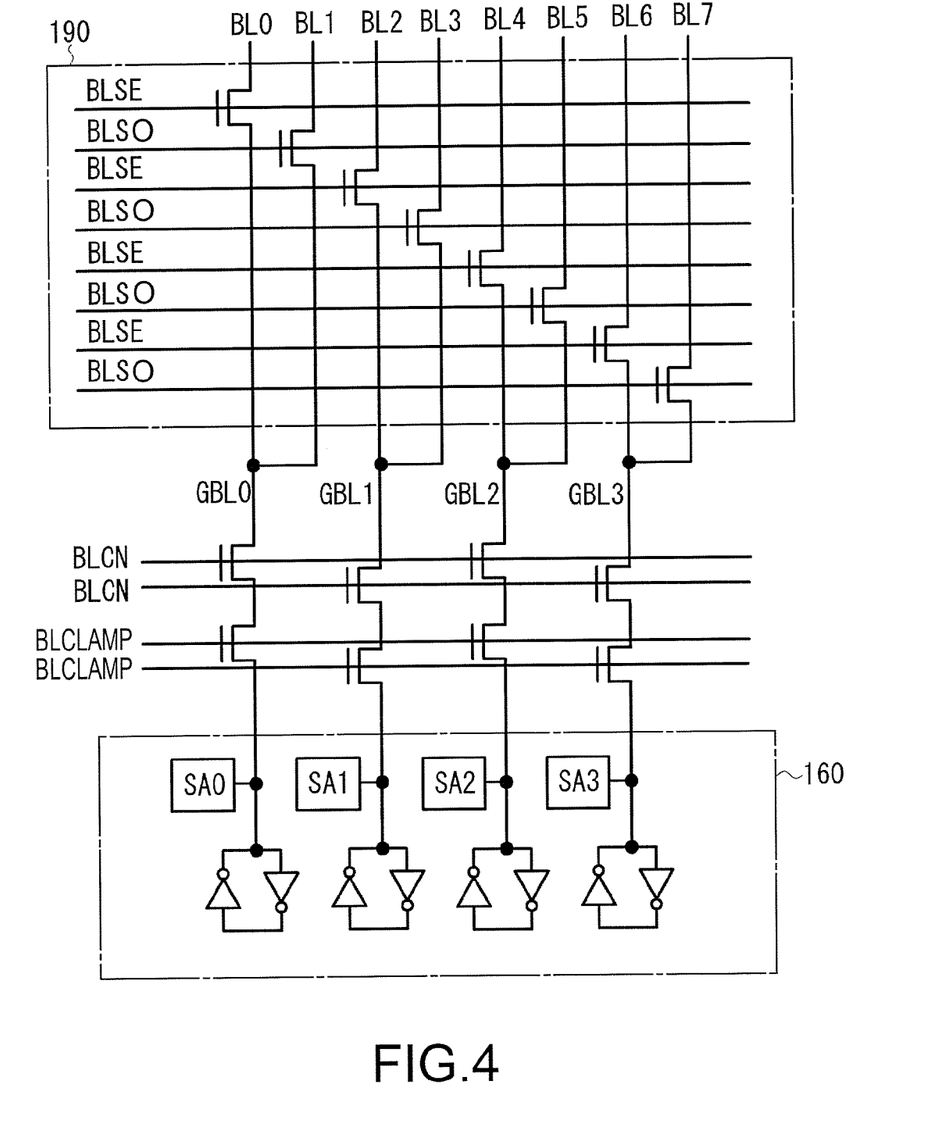
FIG. 4 is a diagram illustrating an example of a selecting method for bit lines of the flash memory according to an embodiment of the invention.

FIG. 4 is an example illustrating a connection relationship between the bit lines and the page buffer/sense circuit 160. For example, for clear description, only eight lines (BL0 to BL7) are illustrated. In FIG. 4, a BLCN signal is a control signal for the page buffer, and configured to control switch transistors. In one preferred example, interferences caused by the capacitive coupling between the adjacent bit lines may be suppressed by selecting even pages (or odd pages) on the same page during the reading operation or the programming operation. When a bit line select circuit 190 selects the even pages (BL0, BL2, BL4 and BL6), transistors connected to select gate lines BLSE are turned on, transistors connected to select gate lines BLS0 are turned off, and the even bit lines are connected to global bit lines GBL0, GBL1, GBL2 and GBL3, respectively. Further, when the even pages (BL1, BL3, BL5 and BL7) are to be selected, the transistors connected to the select gate lines BLSE are turned off, the transistors connected to the select gate lines BLS0 are turned on, and the odd bit lines are connected to the global bit lines GBL0, GBL1, GBL2 and GBL3, respectively. In this way, the page buffer/sense circuit 160 may be commonly used by the even pages or the odd pages. When there are n bit lines on the same word line, the number of the page buffer/sense circuits 160 is n/2. Moreover, the selecting method for the bit lines may also include structures different from the above. For example, in the case of an all bit line structure for selecting all the bit lines at the same time, it is required to prepare the page buffer/sense circuits with the number equal to the number of the bit lines. Sense amplifier circuits SA0 to SA3 are configured to sense a small differential voltage of "0" and "1" from memory cell, and amplify this small voltage to the potentials of logic "0" and "1".

Figure 5:
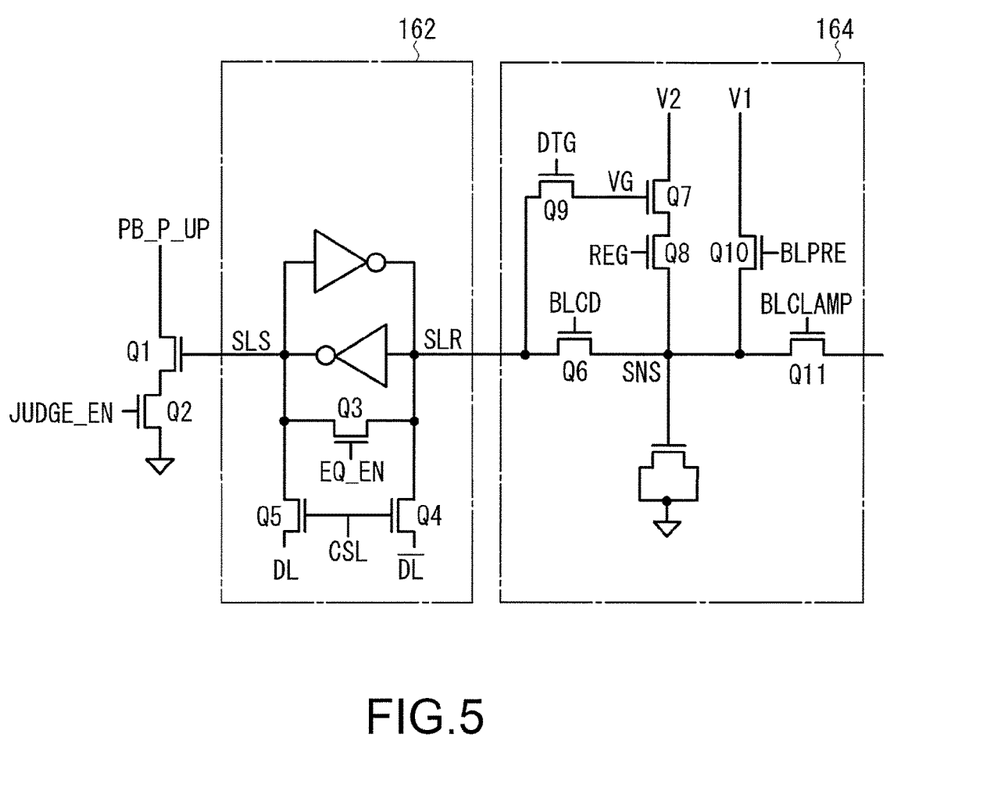
FIG. 5 is a diagram illustrating a structure of a page buffer/sense circuit according to an embodiment of the invention.

FIG. 5 is an example illustrating one page buffer/sense circuit commonly used by two bit lines including one even bit line and one odd bit line. The page buffer/sense circuit 160 includes: a latch circuit 162, which holds data to be programmed, or holds data read from the memory array; a sense circuit 164, which senses data read from the bit line, or sets a voltage corresponding to the data "0" or "1" to be programmed for the selected bit line; and a circuit for outputting a verification result.

The latch circuit 162 includes, for example, two cross coupling inverters for holding data on nodes SLR and SLS. One of the nodes SLR is connected to the sense circuit 164, whereas the node SLS for holding the data inverted from that of the node SLR is connected to a gate of a transistor Q1 for verification. In the verification, a transistor Q2 is enabled by a JUDGE_EN signal driven to H level, and the transistor Q1 is turned on or off according to the potential of the node SLS.

As such, whether the verification is qualified may be determined. For example, the verification is qualified if the node SLS is L level and a PB_P_UP signal is H level. A transistor Q3 configured to equalize levels of two nodes is connected between the node SLS and the node SLR, and the transistor Q3 is driven by an EQ_EN signal. Further, the nodes SLR and SLS are connected to a pair of data lines DL and /DL via transistors Q4 and Q5, and the data lines DL and /DL are connected to the input-output buffer 120. The transistors Q4 and Q5 are turned on or turned off by a CSL signal.

The sense circuit 164 includes: a transistor Q6 for charge transport, which is connected between the node SLR and a sense node SNS; transistors Q7 and Q8, which are connected in series between the sense node SNS and a voltage supplier V2; a transistor Q9, which is connected between the node SLR and a gate of the transistor Q7; a transistor Q10, which is connected between a voltage supplier V1 and the sense node SNS and configured to supply a pre-charge voltage to the bit line; and a transistor Q11, which is configured to clamp a voltage of the bit line. These transistors Q1 to Q11 are NMOS transistors.

For example, during the reading operation, the transistor Q10 is turned on by a BLPRE signal and the transistor Q11 is turned on by a BLCLAMP signal to pre-charge the selected bit line (e.g., the even bit line). The non-selected bit line (e.g., the odd bit line) is connected to GND, for example. Thereafter, the source line select transistor TS of the NAND string is turned on to determine a potential of the selected bit line according to the state of the selected memory cell and hold the potential of data "0" or "1" in the sense node SNS. Subsequently, the transistor Q6 is turned on by a BLCD signal so charges of the sense node SNS are transported to the node SLR of the latch circuit 162 and held in the node SLR. In addition, before the charges are transported to the latch circuit 162, the transistor Q3 is turned on by the EQ_EN signal to equalize the potentials of the nodes SLR and SLS. The data held in the latch circuit 162 is descrambled (as described below) and outputted from the input-output buffer 120 via the data lines DL and /DL.

During the programming operation, the data to be programmed is loaded to the latch circuit 162 via the input-output buffer 120 and the data lines DL and /DL. Subsequently, the transistors Q6 and Q11 are turned on by the BLCD signal and the BLCLAMP signal to set the voltage corresponding to the data "0" and "1" to be programmed for the selected bit line (e.g., the even bit line). VDD is supplied to the non-selected bit line (e.g., the odd bit line). Subsequently, a programming pulse is applied to the selected word line to program the selected memory cell.

In cooperation with the voltage supplier V2, the transistors Q7, Q8 and Q9 may generate inverted or non-inverted data of the node SLR (e.g., which may be used during a programming verification) to be provided to the sense node SNS, for example. When the data to be programmed is "1", the node SLR and the sense node SNS are H level, and a program inhibit voltage is set for the selected bit line. Accordingly, the selected memory cell will not be actually programmed even if the programming pulse is applied thereto. The programming verification is performed as similar to the reading operation, and yet, a verify voltage is applied to the selected word line instead of the read voltage. Since the selected memory cell is not programmed, the selected memory cell is turned on when being applied with the verify voltage. Therefore, the potential of the selected bit line is discharged to GND, and the sense node SNS is L level. Subsequently, a DTG signal is driven to H level within a fixed period so the transistor Q9 is turned on, and the potential of the node SLR (i.e., the potential of H level) is applied to a node VG so the transistor Q7 is turned on. Meanwhile, the transistor Q6 is turned off. Subsequently, VDD is supplied to the voltage supplier V2. When the voltage supplier V2 is supplied with VDD, a voltage of the node VG is further increased through the capacitive coupling. Then, when a REG signal is driven to H so the transistor Q8 is turned on, the sense node SNS is charged to H level. Subsequently, the EQ_EN signal becomes H; the node SLR and the node SLS are equalized; the BLCD signal becomes H; and the transistor Q6 is turned on. In this way, the charges of the sense node SNS are transported to the node SLR. As a result, the node SLS becomes L level and transistor Q1 is turned off. As such, it is determined that the verification is qualified.

On the other hand, the node SLR is L level when the data to be programmed is "0". Therefore, even if the DTG signal becomes H level so the transistor Q9 is turned on during the programming verification, the transistor Q7 will not be turned on since the node VG is L level. Accordingly, the charges from the voltage supplier V2 are not charged to the sense node SNS.

Subsequently, scrambling operations of the flash memory are described below according to the embodiments of the invention. In the NAND flash memory, the memory cell is data "1" after data therein is erased. During the reading operation after the erasing operation, data "FFh" must be outputted, for example. At this time, descrambling operations must be inhibited so all the erased data are "1". On the other hand, although the probability is very small, sometimes the data programmed through the data scrambling may all be "1". This kind of data must be descrambled before it can be read. Due to such restriction, in the NAND flash memory, a flag bit is configured in a redundancy area of the memory array. The flag bit is configured to determine whether the page is erased or programmed. The flag bit is data "1" when the block containing the page is erased and changes to data "0" when the page is programmed.

Figure 6A:
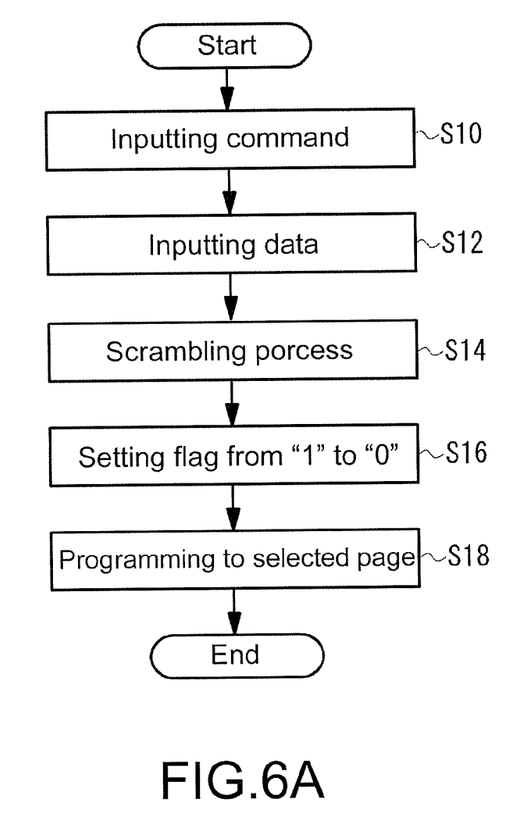
FIG. 6A and FIG. 6B are flowcharts illustrating scrambling operations of the flash memory according to an embodiment of the invention.
Figure 6B:
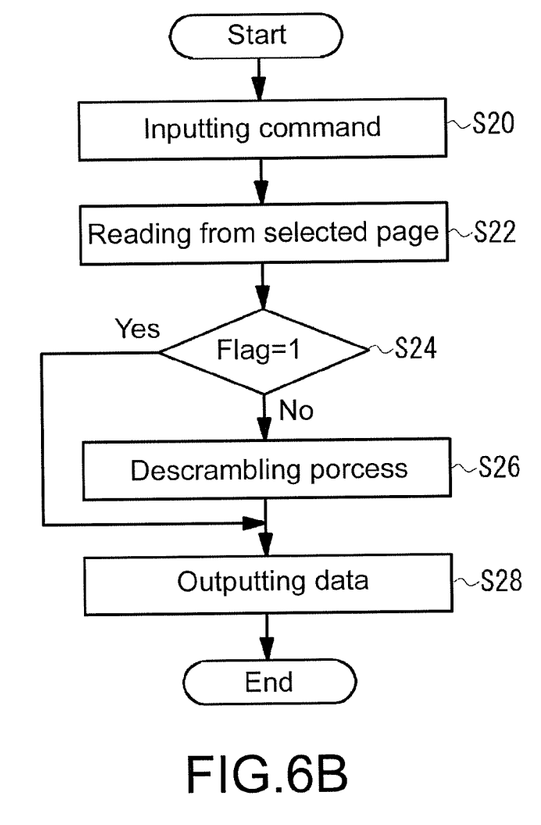

FIG. 6A is a flowchart of the programming operation, and FIG. 6B is a flowchart of the reading operation. During the programming operation, a program command is received from an external controller (S10). Then, an address and data to be programmed are received (S12). A scrambling process is performed on received data by the page buffer/sense circuit 160 (S14). Further, a flag changes from data "1" to "0" to indicate that a selected page is programmed (S116). Next, the scrambled data and the flag are programmed to the selected page (S18).

During the reading operation, when a read command and an address are inputted from an external controller (S20), data is read from a selected page of the memory array (S22). Next, a flag is determined (S24). If the flag is "0", all the data are temporarily considered as "1". Because the data is programmed data, the read data is descrambled by the page buffer/sense circuit 160 (S26), and converted into original data to be outputted (S28). On the other hand, if the flag is "1", because the read data is the erased data, the data is directly outputted without performing a descrambling process thereto (S28).

Figure 7A:
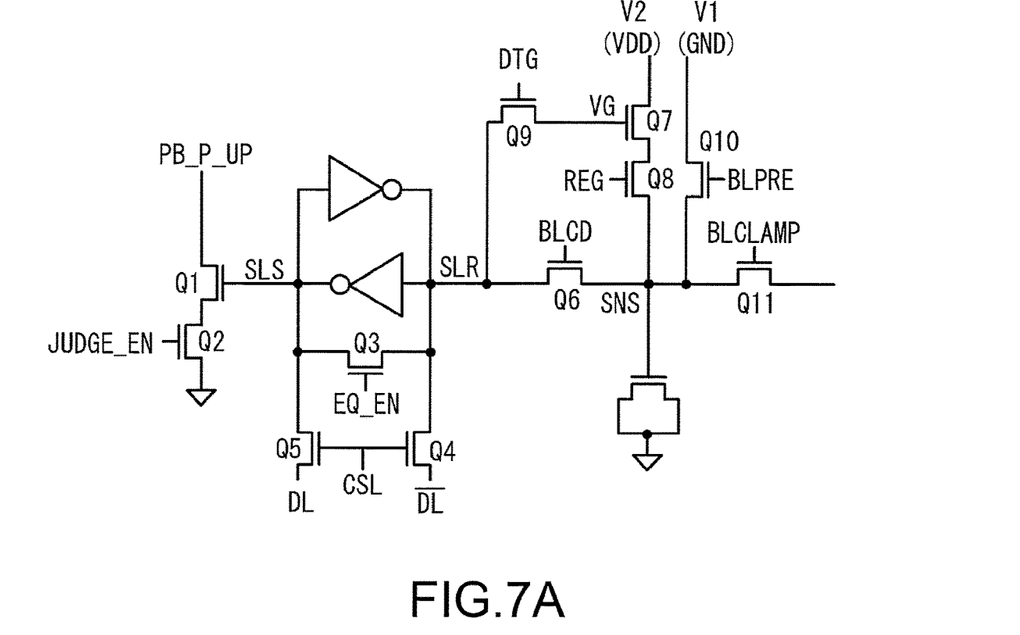
FIG. 7A and FIG. 7B are diagrams illustrating operations of the page buffer/sense circuit for inverting data according to an embodiment of the invention.
Figure 7B:
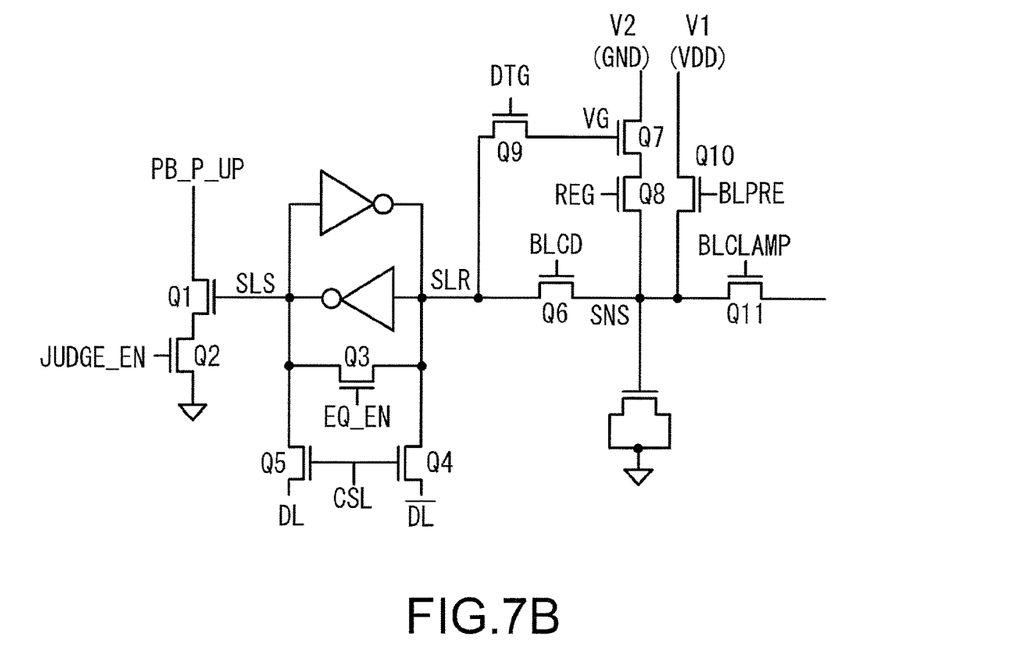

Next, the data scrambling function of the page buffer/sense circuit 160 is described as follows. FIG. 7A illustrates operations for non-inverting data, and FIG. 7B illustrates operations for inverting data. Table 2 illustrates logic levels of each node in conditions when the data is non-inverted and when the data is inverted.

TABLE 2

| Operating sequence | Node | Non-inverting | | Inverting | |
|---|---|---|---|---|---|
| Latch circuit holds original data | SLR | H | L | H | L |
| DTG singal is driven to H SLR→VG | VG | H | L | H | L |
| SNS/SLR reset by V1 | SNS | L | L | H | H |
|  | SLR | L | L | H | H |
| V2 is turned on | V2 | VDD | VDD | GND | GND |
| Voltage of node VG is increased | VG | H + α | L | H | L |
| REG singal is driven to H | SNS | L→H | L | H→L | H |
|  | SLR | L→H | L | H→L | H |

The page buffer/sense circuit 160 performs the scrambling process on all data held in the latch circuit 162 during the programming operation, and performs the descrambling process on all the data held in the latch circuit 162 during the reading operation. The page buffer/sense circuit 160 of the present embodiment substantially uses the structure and the control signal identical to those used in the conventional to perform the scrambling process/the descrambling process.

The scrambling process/the descrambling process of the page buffer/sense circuit 160 inverts and non-inverts the data by using, preferably, a random number. For example, the data is inverted when the random number is "1", and the data is non-inverted when the random number is "0". The random number is, for example, determined based on address information of the selected page when the data is programmed. Generation of the random number may be performed in the page buffer/sense circuit 160, or may be performed by the controller 140 or other circuits.

The latch circuit 162 holds data to be programmed or data read from the memory array. The node SLR is L level when data "0" is held, and the node SLR is H level when data "1" is held.

First of all, the DTG signal is driven to H level within a fixed period so the transistor Q9 is turned on, and the data of the node SLR is transmitted to the node VG and held in the node VG. If the node SLR is H level, the transistor Q7 is turned on. If the node SLR is L level, the transistor Q7 is turned off.

Next, after entering a data-receivable state due to a LT signal (not illustrated), the latch circuit 162 resets the nodes SLR and SLS of the latch circuit 162. The resetting is performed through the following operations, which include: driving the BLPRE signal and the BLCD signal to H level within a fixed period, and supplying a voltage from the voltage supplier V1 to the sense node SNS and the node SLR. In the case of inverting the data, as shown in FIG. 7A, the voltage supplier V1 becomes a ground voltage (GND). Therefore, the sense node SNS and the node SLR also become GND. In the case of non-inverting data, as shown in FIG. 7B, the voltage supplier V1 becomes a power voltage (VDD). Therefore, the sense node SNS and the node SLR also become VDD.

Subsequently, the voltage supplier V2 is activated. In the case of non-inverting the data, the voltage supplier V2 changes from GND to VDD. In the case of inverting the data, the voltage supplier V2 is still GND. When the node VG holds at H level and the voltage supplier V2 changes to VDD, a potential of the node VG is further increased by a potential of +α through the capacitive coupling with the voltage supplier V2. Accordingly, the transistor Q7 is strongly turned on.

Subsequently, the REG signal is driven to H level within the fixed period, and the sense node SNS and the node SLR change to H level or L level according to the node VG. At this time, the BLPRE signal is L level and the BLCD signal is H level. In the case of non-inverting the data, for example, when the original data held in the node SLR is H, the nodes SNS/SLR are reset to L by GND from the voltage supplier V1, and then change from L to H after the voltage supplier V1 changes to VDD. When the original data held in the node SLR is L, the node VG is L level, and this L level does not change even after being reset by the voltage supplier V1. Further, when the voltage supplier V2 changes from GND to VDD, the transistor Q7 is turned off. Therefore, charging of the charges from the voltage supplier V2 is not performed so the nodes SNS/SLR are still L. As such, the data held in the latch circuit 162 is non-inverted.

On the other hand, in the case of inverting the data, for example, when the original data held in the node SLR is H level, it is still held in the node VG at H level. The nodes SNS/SLR still hold at H level even after being reset by VDD from the voltage supplier V1. Also, since the voltage supplier V2 is still GND, the node VG does not change either. Next, when the REG signal is driven to H level, the potentials of the nodes SNS/SLR are discharged to the voltage supplier V2 and become L level. Further, when the original data held in the node SLR is L, it is held in the node VG at L level. The nodes SNS/SLR are reset by VDD from the voltage supplier V1 so their levels change from L to H. Next, when the REG signal is driven to H, the transistor Q7 is turned off so the nodes SNS/SLR still hold at H. As such, the data held by the latch circuit 162 is inverted.

In view of the above, according to the present embodiment, the conventional page buffer/sense circuit may be utilized to perform the scrambling process for the data in the page buffer/sense circuit. Accordingly, it is not required to output the busy signal during the scrambling process, so that the time for denying external access may be reduced.

Next, a modification of the invention is described below. The NAND flash memory is capable of performing a function of sequentially programming data to the same page for n times (n is a natural number equal to or greater than 2) (hereinafter, for clarity, such function is also referred to as a partial page program). The partial page program includes, for example, receiving a program command from an external controller, receiving row address information Ax and column address information Ay1; receiving partial data D1; and starting to program the partial data right after receiving a complete command. Specifically, the partial data D1 is programmed beginning with the column address information Ay1 of the page selected according to the row address information Ax. During aforesaid process, the flash memory outputs the busy signal for denying access to the external controller. By the time when the condition of denying access is removed, a ready signal is outputted. In order to program the next partial data, after receiving the ready signal, the external controller again sends a program command, column address information Ay2, partial data D2 and a complete command to the flash memory as described above, so that the flash memory may program the partial data D2 beginning with column address Ay2 of the same page. Aforesaid process is repeatedly performed for n times. As a result, n partial data D1, D2, . . . , and Dn are programmed in one page.

For example, in the case where one page of the memory array is divided into four sectors, when the partial program is performed on each of the sectors, whether to perform the scrambling process on the data in the page buffer/sense circuit in sector units may also be set. For example, it is set to perform the scrambling process on the data of the sectors 0, 1 and 2, and set to not perform the scrambling process on the data of the sector 3. Such setting may be realized by commands from the external controller, or may be preset in the controller 140. For example, the external controller can set whether to perform the scrambling process in sector units when "0" or "1" is the sequential partial data or when "0" or "1" is overwhelmingly non-uniform partial data.

The preferable embodiment of the invention had been described in detail above, but the invention is not limited to a specific embodiment. It will be apparent to those skilled in the art that various modifications and variations can be made to the structure of the present invention without departing from the scope or spirit of the invention.

What is claimed is:

1. A scrambling method for a semiconductor memory device, comprising:
    holding data to be programmed, performing a scrambling process on the held data and programing the scrambled data to a selected page of a memory array by a page buffer/sense circuit during a programming operation, and
    holding data read from the selected page and performing a descrambling process on the held data by the page buffer/sense circuit during a reading operation,
    wherein the scrambling process or the descrambling process comprises steps of:
        transmitting data held in a node of a latch circuit to a gate of a first transistor;
        resetting the node of the latch circuit by a first voltage supplied by a first voltage supplier;
        supplying a second voltage supplied by a second voltage supplier to the first transistor; and
        inverting or non-inverting the data of the node of the latch circuit by the second voltage via the first transistor.

2. The scrambling method for the semiconductor memory device according to claim 1, wherein
    the scrambling process or the descrambling process inverts or non-inverts the held data.

3. The scrambling method for the semiconductor memory device according to claim 2, wherein
    the scrambling process or the descrambling process inverts or non-inverts the held data according to a random number based on address information of the selected page.

4. The scrambling method for the semiconductor memory device according to claim 1, wherein
    the first voltage is a ground voltage and the second voltage is a power voltage when the data is to be non-inverted, and the first voltage is the power voltage and the second voltage is the ground voltage when the data is to be inverted.

5. The scrambling method for the semiconductor memory device according to claim 1, wherein
    the first voltage is supplied to the node via a second transistor for pre-charging a bit line and a third transistor for enabling a charge transport between a sense node and the node when the node of the latch circuit is to be reset.

6. The scrambling method for the semiconductor memory device according to claim 1, wherein
    the first transistor is turned on when a sense node is charged by the second voltage during a programming verification.

7. A semiconductor memory device, comprising:
    a memory array; and
    a page buffer/sense circuit, holding data to be programmed to a selected page of the memory array, or holding data read from the selected page of the memory array,
    wherein the page buffer/sense circuit performs a scrambling process on the data to be programmed during a programming operation, and performs a descrambling process on the read data during a reading operation, and the page buffer/sense circuit comprises a latch circuit for holding data and a sense circuit connected to the latch circuit, wherein
    the sense circuit comprises: a first transistor, connected to a second voltage supplier, and capable of holding data held in a node of the latch circuit at a gate; a second transistor, connected to a first voltage supplier, and configured to pre-charge a bit line; and a third transistor, for enabling a charge transport between a sense node and the node of the latch circuit, wherein
    when the scrambling process or the descrambling process is performed, the data held in the node of the latch circuit is held at the gate of the first transistor, a first voltage supplied by the first voltage supplier is supplied to the node of the latch circuit via the second transistor and the third transistor, and then a second voltage supplied by the second voltage supplier is supplied to the node of the latch circuit according to an on state of the first transistor.

8. The semiconductor memory device according to claim 7, wherein
    the scrambling process or the descrambling process inverts or non-inverts the held data according to a random number based on address information of the selected page.

9. The semiconductor memory device according to claim 7, wherein
    the first voltage is a ground voltage and the second voltage is a power voltage when the data is to be non-inverted, and the first voltage is the power voltage and the second voltage is the ground voltage when the data is to be inverted.

10. The semiconductor memory device according to claim 7, wherein
    the first voltage supplier supplies a pre-charge voltage to a selected bit line via the second transistor during the reading operation, and the third transistor transmits a potential read from the sense node to the node of the latch circuit during the reading operation.

11. The semiconductor memory device according to claim 7, wherein
    the second voltage supplier supplies the second voltage to the sense node via the first transistor during a programming verification.

* * * * *